United States Patent
Cohen et al.

(10) Patent No.: US 7,291,254 B2
(45) Date of Patent: *Nov. 6, 2007

(54) METHOD FOR ELECTROCHEMICALLY FORMING STRUCTURES INCLUDING NON-PARALLEL MATING OF CONTACT MASKS AND SUBSTRATES

(75) Inventors: Adam L. Cohen, Los Angeles, CA (US); Dennis R. Smalley, Newhall, CA (US)

(73) Assignee: Microfabrica, Inc., Van Nuys, CA (US)

( * ) Notice: Subject to any disclaimer, the term of this patent is extended or adjusted under 35 U.S.C. 154(b) by 181 days.

This patent is subject to a terminal disclaimer.

(21) Appl. No.: 10/724,515

(22) Filed: Nov. 26, 2003

(65) Prior Publication Data

US 2004/0182716 A1 Sep. 23, 2004

Related U.S. Application Data

(60) Provisional application No. 60/429,484, filed on Nov. 26, 2002.

(51) Int. Cl.
*C25D 5/02* (2006.01)

(52) U.S. Cl. .................. 205/135; 205/666; 216/41

(58) Field of Classification Search ............. 216/2, 216/43, 41; 118/721, 406; 156/345.19, 156/345.3, 285, 87; 205/666, 667, 206, 135, 205/118
See application file for complete search history.

(56) References Cited

U.S. PATENT DOCUMENTS

| | | | | |
|---|---|---|---|---|
| 5,301,415 A | * | 4/1994 | Prinz et al. | 29/458 |
| 6,027,630 A | * | 2/2000 | Cohen | 205/135 |
| 2005/0205430 A1 | * | 9/2005 | Thompson | 205/170 |

* cited by examiner

*Primary Examiner*—Roberts Culbert
(74) *Attorney, Agent, or Firm*—Dennis R. Smalley

(57) ABSTRACT

Treatment of substrates, formation of structures, and formation of multilayer structures using contact masks are disclosed where a non-parallel or non-simultaneous mating of various mask contact surfaces to a substrate surface occurs. Some embodiments involve bringing a relative planar mask contact surface and a relative planar substrate surface together at a small angle (but larger than an alignment tolerance associated with the system). Some embodiments involve flexing a mask to make it non-planar and bringing it into contact with a substrate such that progressively more contact between the mask and substrate occur until complete mating is achieved. Some embodiments involve use of gas or liquid pressure to bow a flexible or semi-flexible mask and use a linear actuator to bring the mating surfaces together and to bring the mask into a more planar configuration.

23 Claims, 10 Drawing Sheets

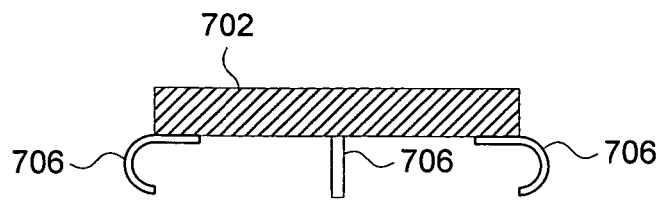
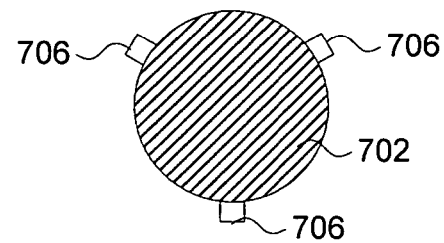
FIG. 11A          FIG. 11B
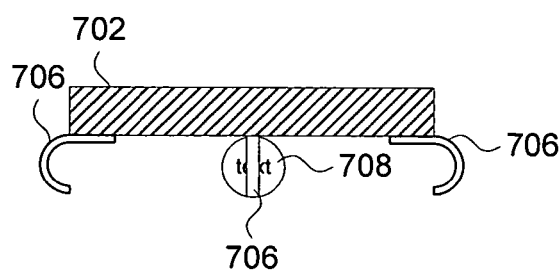
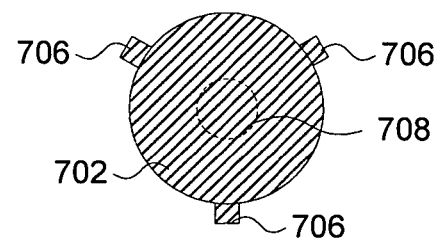
FIG. 12A          FIG. 12B
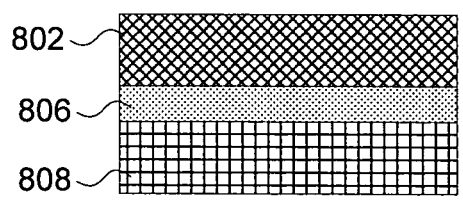
FIG. 13

US 7,291,254 B2

METHOD FOR ELECTROCHEMICALLY FORMING STRUCTURES INCLUDING NON-PARALLEL MATING OF CONTACT MASKS AND SUBSTRATES

RELATED APPLICATIONS

This application claims benefit to U.S. Provisional Patent Application No. 60/429,484, filed Nov. 26, 2002, which is incorporated herein by reference as if set fourth in full.

FIELD OF THE INVENTION

The present invention relates generally to the field of Electrochemical Fabrication and the associated formation of three-dimensional structures (e.g. microscale or mesoscale structures). In particular, it relates to the selective patterning of substrates or previously formed layers using contact masks where the mating and/or un-mating of masks and substrates is made to occur in a non-parallel manner.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEM-Gen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST '99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution, (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Even though electrochemical fabrication as taught and practiced to date, has greatly enhanced the capabilities of microfabrication, and in particular added greatly to the number of metal layers that can be incorporated into a structure and to the speed and simplicity in which such structures can be made, room for enhancing the state of electrochemical fabrication exists. In particular improved techniques for enhancing mask and substrate mating and/or de-mating, particularly when the mating surface area gets large, would be beneficial.

SUMMARY OF THE INVENTION

It is an object of some aspects of the invention to provide an electrochemical fabrication technique which results in improved mating of masks and substrates.

It is an object of some aspects of the invention to provide an electrochemical fabrication technique which results in less flash formation (i.e. thin depositions of material in regions that are intended to be masked but where imperfect mating results in gaps in which material may be deposited).

It is an object of some aspects of the invention to provide an electrochemical fabrication technique which results in more accurate registration between various patterned features on the mask and intended corresponding locations on a substrate.

Other objects and advantages of various aspects of the invention will be apparent to those of skill in the art upon review of the teachings herein. The various aspects of the invention, set forth explicitly herein or otherwise ascertained from the teachings herein, may address one or more of the above objects alone or in combination, or alternatively may address some other object of the invention ascertained from the teachings herein. It is not necessarily intended that all objects be addressed by any single aspect of the invention even though that may be the case with regard to some aspects.

In a first aspect of the invention, a process for forming a multilayer three-dimensional structure including: (a) forming and adhering a layer of material to a substrate, wherein the substrate may include one or more previously formed layers; (b) repeating the forming and adhering operation of (a) a plurality of times to build up a three-dimensional structure from a plurality of adhered layers; wherein the formation of each of at least a plurality of layers, includes: (1) obtaining a selective pattern of deposition of a first material having at least one void, including at least one of: (a)

selectively depositing a first material onto the substrate such that at least one void remains, wherein the depositing includes: (i) bringing a mating surface of a contact mask and a mating surface of the substrate together, wherein initial contact between the mating surface of the substrate and the mating surface of the contact mask occurs in a controlled manner at only selected locations, and wherein continued relative movement between the mask and the substrate bring substantially all relevant mating surfaces of the mask into contact with the substrate; (ii) depositing the first material onto the substrate with the contact mask in place; (iii) separating the contact mask and the substrate to expose the at least one void; or (b) depositing a first material onto the substrate and selectively etching the deposit of the first material to form at least one void therein, wherein the etching includes: (i) bringing a mating surface of a contact mask and a mating surface of the first material together, wherein initial contact between the mating surface of the first material and the mating surface of the contact mask occurs in a controlled manner at only selected locations, and where after continued relative movement of the mask and the substrate bring substantially all of the mating surface of the mask into contact with the first material; (ii) etching into the first material with the contact mask in place to form at least one void; and (iii) separating the contact mask and the first material.

In a second aspect of the invention, a process for forming a multilayer three-dimensional structure including: (a) forming and adhering a layer of material to a substrate, wherein the substrate may include one or more previously formed layers; (b) repeating the forming and adhering operation of (a) a plurality of times to build up a three-dimensional structure from a plurality of adhered layers; wherein the formation of each of at least a plurality of layers, includes: (1) obtaining a selective pattern of deposition of a first material having at least one void, including at least one of: (a) selectively depositing a first material onto the substrate such that at least one void remains, wherein the depositing includes: (i) bringing a mating surface of a contact mask and a mating surface of the substrate together, wherein at initial contact, the mating surface of the mask has a first curvature and a mating surface of the substrate has a second curvature, wherein the first curvature has a nominal radius that is less than that of the second curvature, and wherein after initial contact a separation of the mask and the substrate is further reduced so that additional mating occurs and such that one or both of the first and second curvatures change to so that that first and second curvatures become more alike; (ii) depositing the first material onto the substrate with the contact mask in place; (iii) separating the contact mask and the substrate to expose the at least one void; or (b) depositing a first material onto the substrate and selectively etching the deposit of the first material to form at least one void therein, wherein the etching includes: (i) bringing a mating surface of a contact mask and a mating surface of the first material together, wherein at initial contact, the mating surface of the mask has a first curvature and a mating surface of the first material has a second curvature, wherein the first curvature has a nominal radius that is less than that of the second curvature, and wherein after initial contact a separation of the mask and the substrate is further reduced so that additional mating occurs and such that one or both of the first and second curvatures change to so that that first and second curvatures become more alike; (ii) etching into the first material with the contact mask in place to form at least one void; and (iii) separating the contact mask and the first material.

In a third aspect of the invention, a process for forming a multilayer three-dimensional structure including: (a) forming and adhering a layer of material to a substrate, wherein the substrate may include one or more previously formed layers; (b) repeating the forming and adhering operation of (a) a plurality of times to build up a three-dimensional structure from a plurality of adhered layers; wherein the formation of each of at least a plurality of layers, includes: (1) obtaining a selective pattern of deposition of a first material having at least one void, including at least one of: (a) selectively depositing a first material onto the substrate such that at least one void remains, wherein the depositing includes: (i) bringing a mating surface of a contact mask and a mating surface of the substrate together, wherein at initial contact, the mating surface of the mask is more convex relative to the mating surface of the substrate, and wherein after further relative movement between the mask and the substrate mating is completed; (ii) depositing the first material onto the substrate with the contact mask in place; (iii) separating the contact mask and the substrate to expose the at least one void; or (b) depositing a first material onto the substrate and selectively etching the deposit of the first material to form at least one void therein, wherein the etching includes: (i) bringing a mating surface of a contact mask and a mating surface of the first material together, wherein at initial contact, the mating surface of the mask is more convex relative to the mating surface of the substrate, and wherein after further relative movement between the mask and the substrate mating is completed; (ii) etching into the first material with the contact mask in place to form at least one void; and (iii) separating the contact mask and the first material.

In a fourth aspect of the invention, a process for treating a surface of a substrate, including: (a) bringing a mating surface of a contact mask and a mating surface of the substrate together, wherein initial contact between the mating surface of the substrate and the mating surface of the contact mask occurs in a controlled manner at only selected locations, and where after continued relative movement of the mask and the substrate bring substantially all relevant mating surfaces of the mask into contact with the substrate; (b) treating the substrate with the contact mask in place.

In a fifth aspect of the invention, a process for treating a surface of a substrate, including: (a) bringing a mating surface of a contact mask and a mating surface of the substrate together, wherein at initial contact, the mating surface of the mask has a first curvature and a mating surface of the substrate has a second curvature, wherein the first curvature has a nominal radius that is less than that of the second curvature, and where after additional mating occurs while bringing the first curvature closer to that of the second curvature; (b) treating the substrate with the contact mask in place.

In a sixth aspect of the invention, a process for treating a surface of a substrate, including: (a) bringing a mating surface of a contact mask and a mating surface of the substrate together, wherein at initial contact, the mating surface of the mask is more convex relative to the mating surface of the substrate, and wherein after further relative movement between the mask and the substrate mating is completed; (b) treating the substrate with the contact mask in place.

Further aspects of the invention will be understood by those of skill in the art upon reviewing the teachings herein. Other aspects of the invention may involve combinations of the above noted aspects of the invention. Other aspects of the invention may involve apparatus that can be used in implementing one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 11A and 11B depict, a side view and a top view respectively, of a substrate holder that allows tilting to occur so as to allow non-planarity between mating surfaces of the mask and of the substrate to become coplanar during mating.

FIGS. 12A and 12B depict, a side view and a top view respectively, of a substrate holder that allows tilting to occur with reduced tenancy for lateral displacement so as to allow non-planarity between mating surfaces of the mask and of the substrate to become coplanar during mating.

FIG. 13 depicts an alternative substrate or substrate holder design for allowing some tilting to between the mask and the substrate to occur during mating so as to allow the surfaces to become coplanar.

DETAILED DESCRIPTION OF PREFERRED EMBODIMENTS OF THE INVENTION

FIGS. 1A-1C, 2A-2F, and 3A-3C illustrate various aspects of electrochemical fabrication that are known. Other electrochemical fabrication techniques are set forth in the '630 patent, in the various previously incorporated publications, in patent applications incorporated herein by reference, still other may be derived from combinations of various approaches described in these publications, patents, and applications, or are otherwise known or ascertainable by those of skill in the art. All of these techniques may be combined with those of the present invention to yield enhanced embodiments.

Figure 1A:
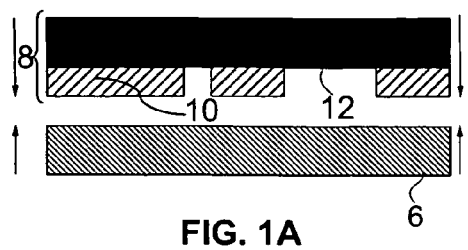
FIGS. 1A-1C schematically depict side views of various stages of a CC mask plating process, while FIGS. 1D-G schematically depict a side views of various stages of a CC mask plating process using a different type of CC mask.
Figure 1B:
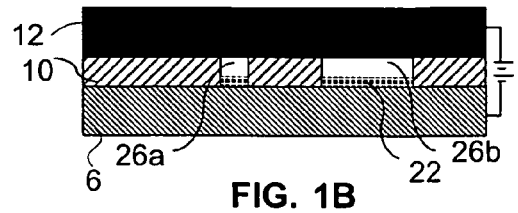
Figure 1C:
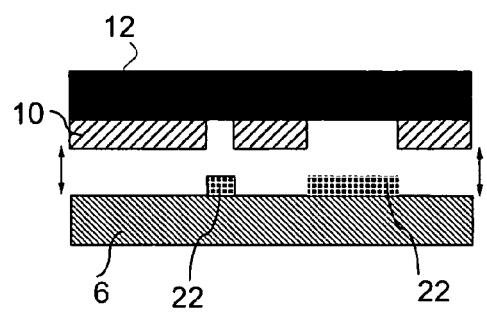
Figure 1D:
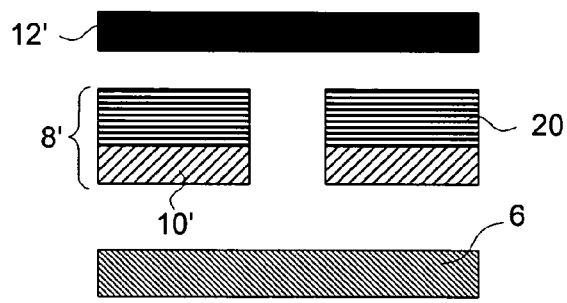
Figure 1E:
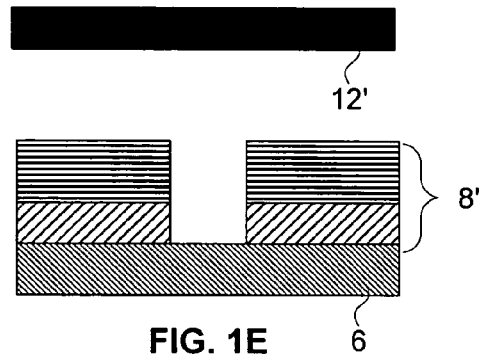
Figure 1F:
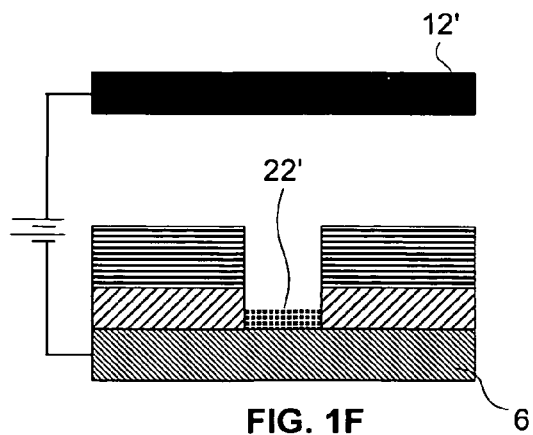
Figure 1G:
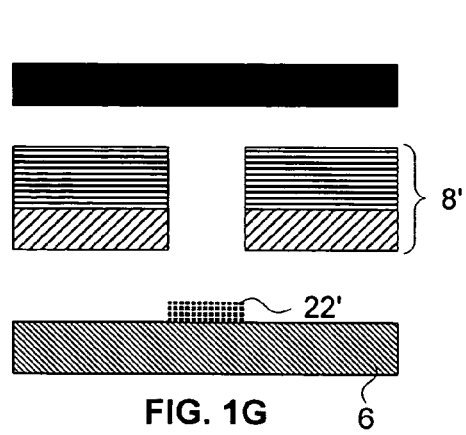
Figure 2A:
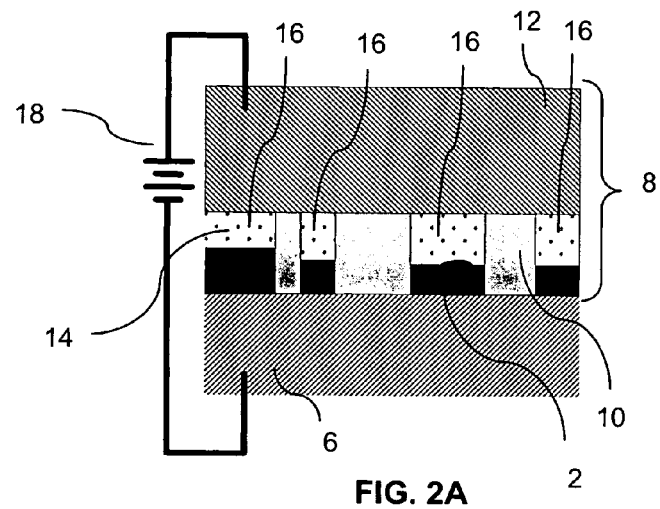
FIGS. 2A-2F schematically depict side views of various stages of an electrochemical fabrication process as applied to the formation of a particular structure where a sacrificial material is selectively deposited while a structural material is blanket deposited.
Figure 2B:
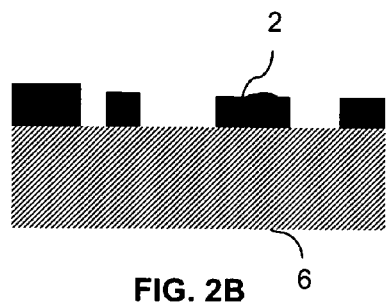
Figure 2C:
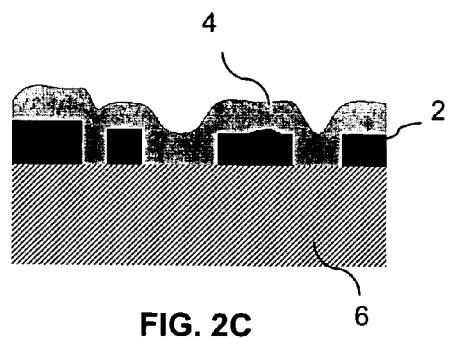
Figure 2D:
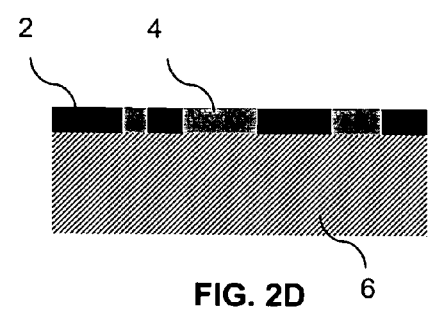
Figure 2E:
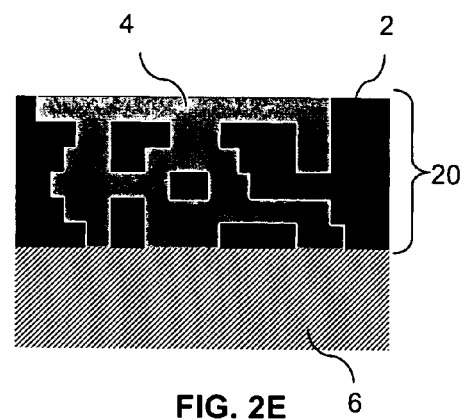
Figure 2F:
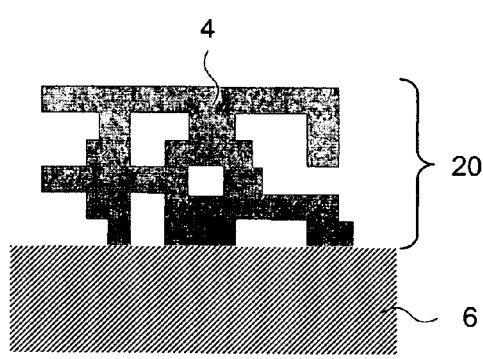
Figure 3A:
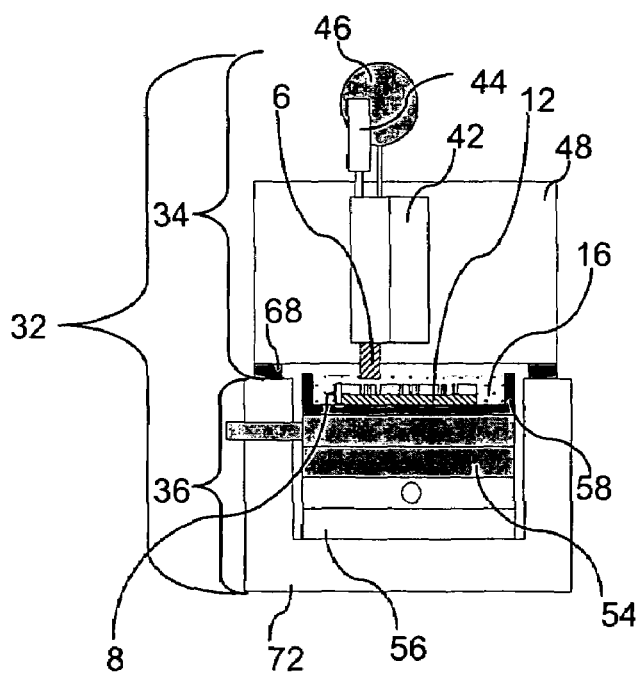
FIGS. 3A-3C schematically depict side views of various example subassemblies that may be used in manually implementing the electrochemical fabrication method depicted in FIGS. 2A-2F.
Figure 3B:
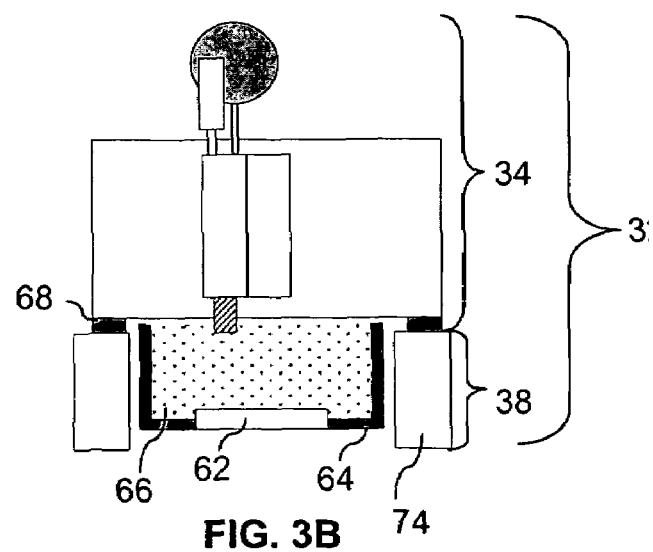
Figure 3C:
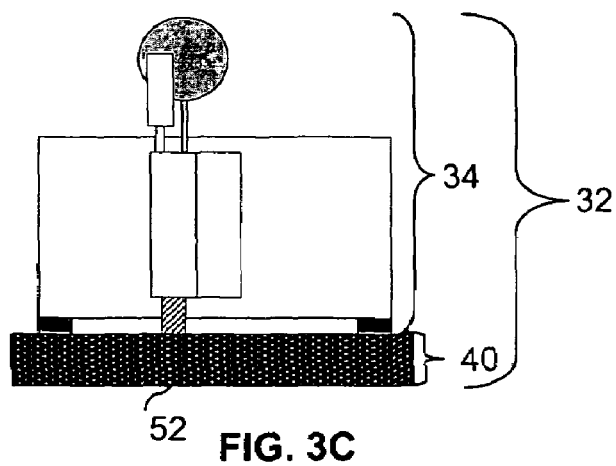
Figure 4A:
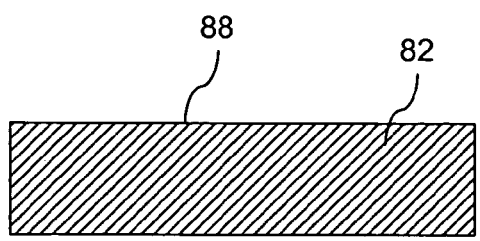
FIGS. 4A-4F schematically depict the formation of a first layer of a structure using adhered mask plating where the blanket deposition of a second material overlays both the openings between deposition locations of a first material and the first material itself.
Figure 4B:
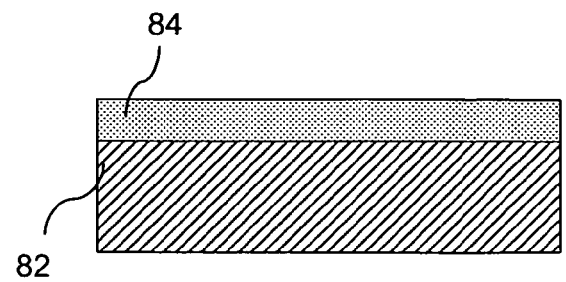
Figure 4C:
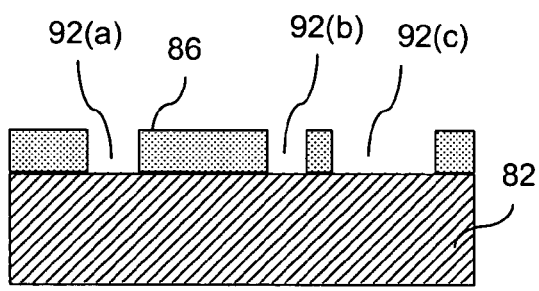
Figure 4D:
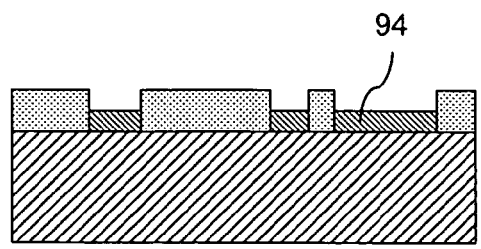
Figure 4E:
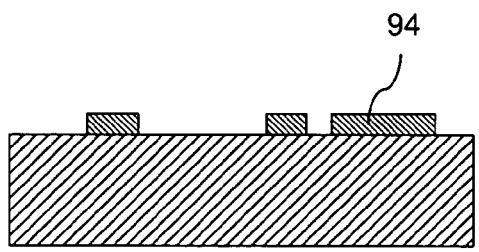
Figure 4F:
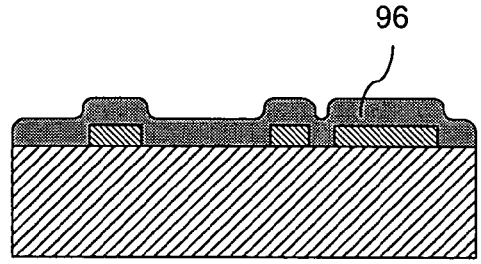
Figure 4G:
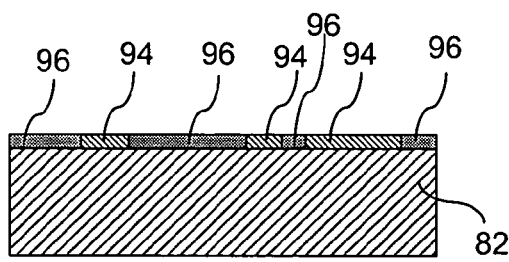
FIG. 4G depicts the completion of formation of the first layer resulting from planarizing the deposited materials to a desired level.
Figure 4H:
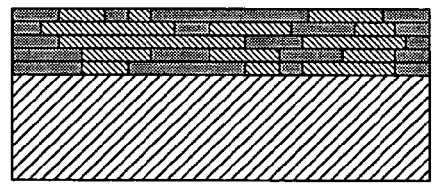
FIGS. 4H and 4I respectively depict the state of the process after formation of the multiple layers of the structure and after release of the structure from the sacrificial material.
Figure 4I:
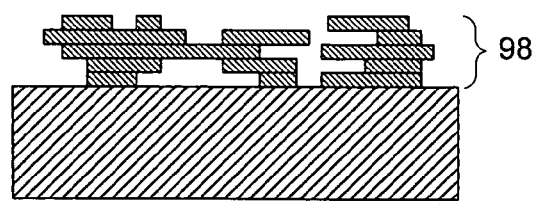

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Electrochemical Fabrication may be used to form multi-layer structures (e.g. components, devices, or systems) from a plurality of overlaying and adhered layers. Masks, that are independent of a substrate to be operated on, are used in the various embodiments of the invention. When forming a single layer structure, such a mask is used to achieve selective patterning of at least one material. During formation of a multi-layer structure such a mask may be used in forming a single layer, a plurality of layers, or even all layers of a multilayer structure. In some embodiments, such masks may be used multiple times during the formation of a given single layer. In various embodiments of the invention these masks may allow selective deposition of material onto the substrate or they may allow selective etching of a substrate where the created voids may be filled with a selected material that may then be planarized to yield in effect a net selective deposition of the selected material. In the various embodiments of the invention, such masks are used in a contact mode though if mating isn't formed perfectly, portions of the mask and the substrate may in effect be used in proximity mating manner. In the contact mode the mask and substrate physically mate to form substantially independent process pockets. In some embodiments, such masks may have conformable contact surfaces (i.e. surfaces that contact the substrate have sufficient deformability or flexibility that they can substantially conform to a surface of the substrate to form a seal with it) or they may have semi-rigid or even rigid surfaces. In some embodiments, adhered masks may be used on some layers. In some embodiments, support portions of contact masks may be flexible or semi-flexible to such an extent that allows the mating surface of the mask to be made non-planar during mating and un-mating operations. In some embodiments, where masks of the contact, proximity and/or adhered type are used to selectively deposit material, post deposition etching operations may be performed to remove flash deposits (i.e. thin undesired deposits that result from imperfect mating between a mask and the substrate).

It is believed that enhancing the flexibility of the mask support material over that which has been proposed previously may enhance the ability to mate masks and substrates as they both become larger in cross-sectional dimension (e.g. attain cross-sectional widths or diameters of 2 inches, 4 inches, 8 inches, or even 12 inches, or greater). It is believed that if the support material is flexible or semi-flexible it may be able to enhance the mating of the contact material of the mask by accommodating for larger scale variations in planarity of either the surface of the contact material on the mask or of the substrate itself than can be accommodated for by the flexibility of the contact material alone. Similarly, such flexibility may be better able to accommodate larger variations in orientation between the mask and the substrate than can be accommodated by the contact material alone.

When the first material is flexible or semi-flexible, it may be possible to manipulate the mask shape during mating and un-mating with the substrate such that mating may occur in such a manner as to leave paths for excess electrolyte to escape (e.g. when the mask is mated to the substrate from one side and then working to the other side—see FIGS. 7A-7C which are discussed herein later; when the mask is mated to the substrate first in the center and mating is continued by working toward the sides—see FIGS. 8A-8G, or when the mating may occur in a geometry sensitive manner). Similarly when removing the mask from a mated position it may be possible to flex the mask to cause unsealing to occur from one edge first and then have it propagate to the other edge—see FIGS. 7C-7F—or from all edges and then to the center. In embodiments where the flexing or flexibility of the first material will be used in either mating or un-mating masks and substrate, the masks may be formed from a single support material and a single contact material or from multiple support materials and/or patterned portions that include multiple materials including one or more distinct contact materials. In such embodiments, the mask material that mates with the substrate may have a flexibility that is equal to that of the other materials, less than that of the other materials, or even greater than that of the other materials.

In some embodiments the invention may be practiced to form multi-layer three-dimensional structures for example by forming a layer of at least one material on a substrate that may include one or more previously deposited layers of one or more materials and then repeating the forming operation one or more times to form at least one subsequent layer on at least one previously formed layer to build up a three-dimensional structure from a plurality layers. The formation of at least one layer may include (1) supplying a substrate on which one or more successive depositions of one or more materials may have occurred and will occur; (2) supplying a mask that includes at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs.

In some embodiments the invention may be practiced so as to modify a substrate for example by forming a layer of at least one material on a substrate that may include one or more previously deposited layers of one or more materials, wherein the forming of at least one layer, includes (1) supplying a substrate on which one or more successive depositions of one or more materials may have occurred and will occur; (2) supplying a mask that includes at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs.

In some embodiments the invention may take the form of an apparatus for modifying a substrate or producing multi-layer three-dimensional structures which for example may include (a) a substrate on which one or more successive depositions of one or more materials may have occurred and will occur; (b) a mask that comprises at least one void and at least one surrounding protrusion of material; (c) a stage for bringing the at least one protrusion of the mask into proximity to or into contact with the substrate so as to form at least one electrochemical process pocket having a desired registration with respect to any previous depositions and providing a desired electrolyte within the at least one electrochemical process pocket; (d) a power supply for applying a desired electrical activation between at least one electrode, that may be part of the mask or separate therefrom, and the substrate, such that a desired modification of the substrate occurs; and (e) preferably (e.g. for the apparatus for forming multilayer structures), but not necessarily, a least one controller for controlling the stage and the power supply.

The substrate may for example be in the form of a conductive material (e.g. a selected metal, or the like), a moderately conductive material (e.g. doped silicon, or the like), a dielectric or mixed dielectric/conductor/semiconductor base on which a conductive seed layer has been formed. The stage may include a linear stage driven by a linear motor or stepper motor or other rotary motor that drives a ball screw or other mechanism for translating rotational motion to linear motion, it may alternatively or additionally include a pressure driven expanding or collapsing bellows mechanism. The stage may include an encoder for position and it may include multiple stages such as course movement stages and fine movement stages. It may allow linear motion in all three directions and/or rotational motion. In particular the stage may provide the ability to tilt the either the substrate or the mask in order to achieve a desired amount of non-parallelness or non-planarity between the mating surface of the mask and that of the substrate. The power supply may take on any appropriate form required to drive the given reaction. For example it may be a DC or pulsed DC supply; it may be controlled to output a fixed current or fixed voltage or a variable current or variable voltage. It may include feedback for accurate control. The controller may take a variety of forms. For example, it may be a computer programmed in a manner to control the other components in a desired way (e.g. to repeat operations a plurality of times to build up multi-layer structures) or it may be individual control elements for different apparatus components that are each controlled by an operator. The computer may include a monitor of printer for supplying information to an operator user, a key board, mouse, touch screen, or the like for accepting input form an operator. The computer may be connected to a network to allow remote control of the system or control of multiple systems from or by a single computer.

Many other apparatus components may also be incorporated into some embodiments: (1) a rigid frame for holding system components with appropriate accuracy and shielding panels for allowing a controlled environment to exist, (2) controlled air or gas systems, (3) temperature control systems, (4) substrate cleaning systems, (5) substrate activation systems, (6) plating systems and electrolyte replacement or cleaning systems, (7) air filters and circulation systems, (8) planarization systems, (9) process monitoring equipment such as cameras, data acquisition and storage systems, (10) access doors and panels, (11) viewing windows or cameras and monitors, (12) operator warning systems, including lights and auditory signals, and the like.

In alternative embodiments, masks may have protrusions that include more than two or even three materials or even a mixture of numbers of materials dependent on cross-sectional location within the mask. In still other embodiments, the mask support structure may include more than two materials where, for example, a more flexible material may be located against the protruding material or it may be located against a further mask support structure (not shown).

In alternative embodiments, the masks described above may be of the anode-less or electro-less type. Such masks were described herein above in association with FIGS. 1D-1G. They are described in U.S. Pat. No. 6,027,630, referenced herein above. They are further described in U.S. Patent Application Nos. 60/429,483 and 10/677,498. The former of which was filed on Nov. 26, 2002 while the later was filed on Oct. 1, 2003. Both were filed by Adam L. Cohen, et al. and were entitled Multi-Cell Masks and Methods and Apparatus for Using Such Masks to Form Three-Dimensional Structures. Both of these patent applications are incorporated herein by reference as if set forth in full.

In some embodiments, all portions of the protruding material of the mask may be pressed against a substrate while in other embodiments, not all openings of the mask may be sealed by contact between the substrate and the protruding material. It is most preferred that full contact and sealing be made for all openings but in circumstances where some proximity positioning of the mask occurs, it is preferred that the positioning be close enough that deposition outside the region of the mask openings (or voids) receive a deposition that is no thicker than about 1-2 µm (micron) and more preferably no thicker than about 0.5-1 µm. In other embodiments, when proximity positioning occurs, it is preferable that depositions outside the mask openings will not exceed 20% of the desired height of the deposition that is to occur within the openings, more preferably less than about 10%, and most preferably less than about 5%. These same numbers and percentages preferably hold when deposition is to occur using mating of rigid mask surfaces to a substrate. These same numbers and percentages preferably hold, mutatis mutandis, for situations where the mask is to be used for etching operations.

Figure 5A:
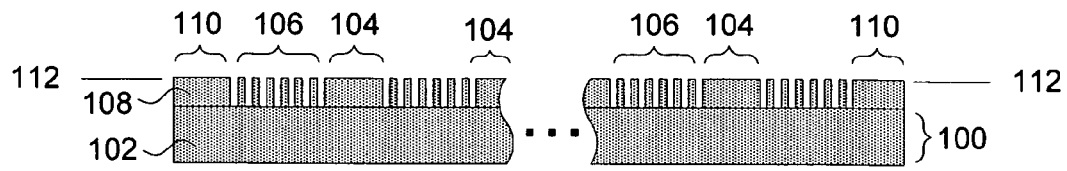
FIG. 5A depicts a side view of an up-facing contact mask having multiple patterning locations (e.g. each corresponding to an individual die or each corresponding to a separate cross-section of a structure to be formed).

FIG. 5A depicts a side view of an up-facing contact mask having multiple patterning locations (e.g. each corresponding to an individual die or each corresponding to a separate cross-section of a structure to be formed).

Mask 100 of FIG. 5A includes a support portion 102 and a patterned portion 108. The upper surface (designated by line 112) of patterned portion 108 provides a mating surface or contact surface for the mask. If the material of patterned portion 108 is a single material 108 may also be considered not only the patterned portion of the mask but also the contact portion or contact material of the mask. The contact portion of the mask may be considered to consist of various distinct regions. For example, the mask of FIG. 5A includes a contact portion 110 that defines the perimeter of the mask. As shown, the mask also includes a plurality of regions 106. Each of the regions 106 defines an individual patterning region which may be used for different purposes depending on the details of any particular build process and the size of the substrate with which the mask will be used. Each of the individual patterning regions 106 may define a similar masking pattern or a different masking pattern. Identical masking patterns may be used for the simultaneous production of multiple copies of a single article. In these cases individual masking regions may be considered to correspond to individual die produced in a batch fabrication process. Alternatively, the individual patterning regions 106 may define different cross sections of an article to be formed where each pattern 106 would be used in a serial manner (e.g. to stack layers one on top of one another) as apposed to in a parallel manner (e.g. to build layers of separate structures side-by-side). In FIG. 5A individual patterning regions 106 are separated by wider contact regions 104.

Figure 5B:
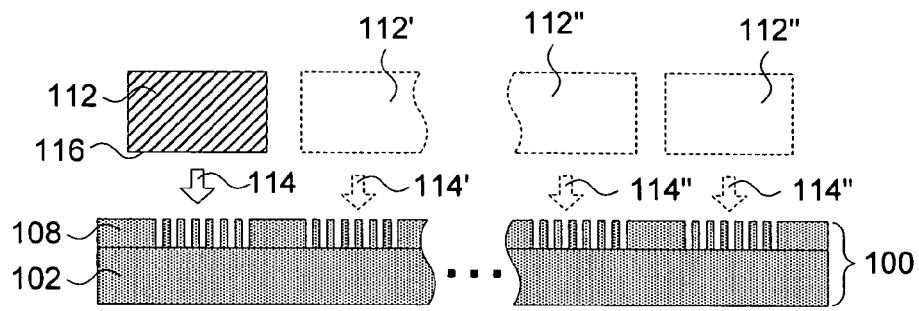
FIG. 5B depicts the mask of FIG. 5A located below a substrate that has a width appropriate for mating with only one of the patterning locations (e.g. die locations) at a time.

FIG. 5B depicts the mask of FIG. 5A located below a substrate that has a width appropriate for mating with only one of the patterning locations at a time (e.g. die locations). Mask 100 of FIG. 5B includes a support portion 102 and a patterned portion 108 as did the mask of FIG. 5A. Shown above the left most patterning region of FIG. 5B is a substrate 112 which can be translated in direction 114 to mate with the left most individual patterning location 106 of the mask so that selective treatment of substrate surface 116 may occur. Other individual patterning regions of mask 100 are shown with substrates 112', 112" and 112'" located above them where the substrates may be mated to the mask by moving in directions 114', 114" and 114'" so that patterning may occur.

In FIG. 5B, substrate 112 is shown with a solid boundary and patterned as it represents a substrate that is being operated on whereas substrates 112', 112" and 112'" are represented by broken boundaries and are unfilled as they represent modified forms of substrate 112 that have undergone serial processing by mask 100.

Figure 5C:
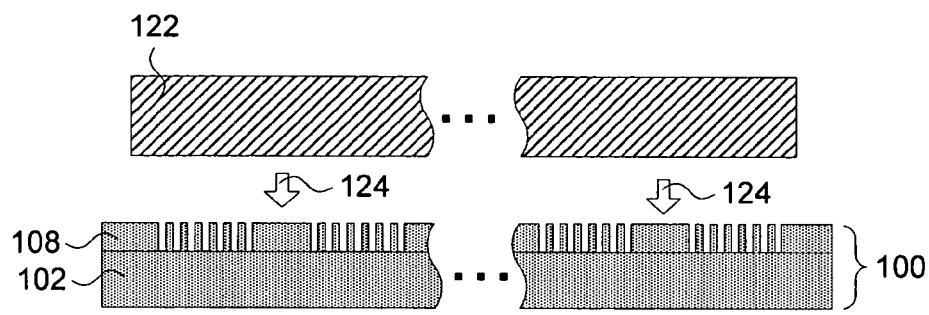
FIG. 5C depicts the mask of FIG. 5A located below a substrate that has a width appropriate for mating with all of the patterning locations simultaneously (e.g. allowing the ability to batch form numerous separate structures simultaneously).

FIG. 5C depicts the mask of FIG. 5A located below a substrate that has a width appropriate for mating with all of the patterning locations of the mask simultaneously (e.g. allowing the ability to batch fabricate numerous separate structures simultaneously).

Mask 100 of FIG. 5C includes a support portion 102 and a patterned portion 108 as did the masks of FIGS. 5A and 5B. However, located above mask 100 is a substrate 122 which has a width corresponding to that of the mask itself and which can be mated simultaneously to the entirety of mask 100 by relatively moving in direction 124. After mating, the substrate may be selectively treated using the mask. The use of such a mask and substrate as illustrated in FIG. 5C is conducive to the batch processing of a plurality of identical structures simultaneously or alternatively to the batch production of numerous different structures simultaneously.

Mask to substrate configurations other than those shown in FIGS. 5B and 5C are possible. For example, the substrate may be wider or have a larger area than the mask that is used in patterning it. This would enable the mask to be used sequentially to pattern different portions of the substrate at different times.

Figure 5D:
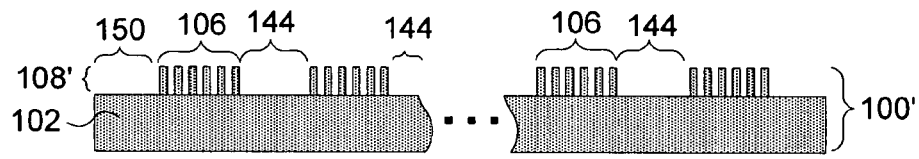
FIG. 5D depicts an alternative mask configuration where separate individual patterning areas (e.g. die areas) are not separated by contact material but instead are separated by large gaps.

FIG. 5D depicts an alternative mask configuration where separate individual patterning areas (e.g. die areas) are not separated by contact material but instead are separated by large gaps.

Mask 100' of FIG. 5D includes a support portion 102 and a patterned portion 108'. Where the patterned portion includes individual patterning regions 106, as did the mask of FIG. 5A. In the mask of FIG. 5D the perimeter region of the patterned portion of the mask is not defined by the existence of contact material 110 as it was in FIG. 5A but instead is defined by elements 150 where no patterned or contact material exists. Similarly the regions separating individual patterning regions 106 may be separated by gaps in the patterning material as indicated by reference numerals 144. Such a mask may have some form of dielectric or shielding material on the surface of support 102 in regions 150 and 144 to inhibit the mask from inducing treatment to a substrate in those regions, or alternatively the substrate in those regions may have shielding material applied thereto.

Figure 5E:
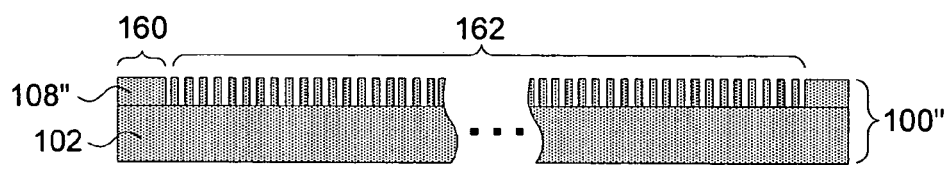
FIG. 5E depicts an alternative mask configuration where the mask area is not divided into multiple individual die or cross-sectional patterns but instead defines a single desired pattern.

FIG. 5E depicts an alternative mask configuration where the mask area is not divided into multiple individual die or cross-sectional patterns but instead defines a single desired pattern. Mask 100" of FIG. 5E includes a support portion 102 and a patterned region 108" where the patterned region 108 includes a perimeter portion 160, defined by a solid region of contact material, and a single patterning region 162 located within region 160. A mask such as that shown in FIG. 5E may be used in its entirety to pattern a substrate or portion of a substrate in forming a single structure.

FIGS. 6A-6F depict schematic side views that define a non-parallel mating operation and non-parallel un-mating operation that may be used together or separately in accordance with a first embodiment of the invention where the mask support is substantially inflexible.

Figure 6A:
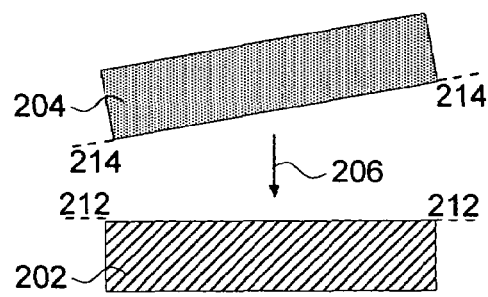
FIGS. 6A-6F defines a non-parallel mating operation and non-parallel un-mating operation that may be used together or separately in accordance with a first embodiment of the invention where the mask support is substantially inflexible.

FIG. 6A depicts a side view of a substrate 202 to which a contact mask 204 is to be mated by moving in the direction indicated by arrow 206. Substrate 202 has a contact or mating surface 212 while mask 204 has a contact or mating surface 214 which is defined by a pattern of protruding elements (not shown).

Figure 6B:
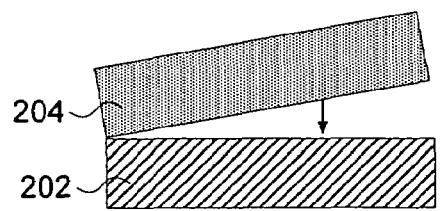
Figure 6C:
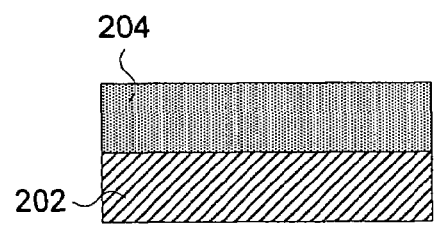

FIG. 6B shows the state of the process after substrate 202 and mask 204 have been brought into initial contact along their left most edges. If the mating surface of mask 204 includes a conformable material, a line of mating will progress from the left most side of the mask and substrate toward their right side most sides as continued relative motion of the mask and substrate occurs. Until the point is reached where mating is completed across the entire intended mating surfaces of substrate 202 and mask 204 as indicated in FIG. 6C. Once mated the mask may be used in selectively treating those portions of the contact surface of substrate 202 which are not actually shielded by the protrusions of mating material of mask 204. After treatment the mask and substrate may be separated.

Figure 6D:
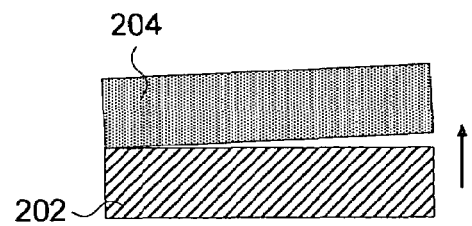
Figure 6E:
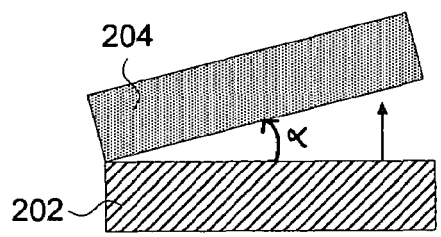
Figure 6F:
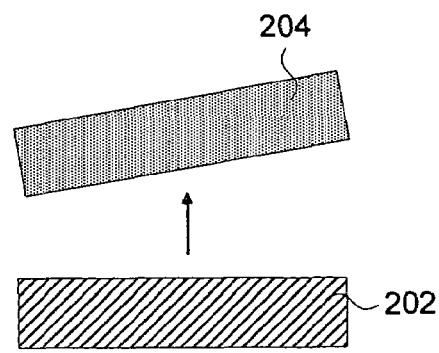

FIG. 6D depicts the beginning of a separation process where the mask and substrate will be pulled apart such that an angle will develop between the surfaces (i.e. more strictly speaking—an angle will exist between a normal to the mating surface of mask 204 and a normal to the mating surface of substrate 202). As illustrated in FIG. 6D the mask is initially separated on its right side and as indicated in FIG. 6E that angular separation continues to increase until a desired angle α (alpha) is reached at which point separation continues without necessarily changing the angle α as shown in FIG. 6F.

In alternative embodiments other forms of continued separation may be used such as combinations of translational separation and as well as increased angular separation. In some embodiments, angular separation may be continued until α reaches a value of 90 degrees or more.

In some embodiments the mating procedure as depicted in FIGS. 6A-6C may be used without necessarily using an angular un-mating procedure, e.g. as indicated in FIGS. 6C to 6F. Similarly in other embodiments the angular separation procedure as indicated in FIGS. 6C to 6F may be used without using an initial angular mating procedure, e.g. as indicated in FIGS. 6A-6C.

FIGS. 7A-7F depict schematic side views that define a non-parallel mating operation and non-parallel un-mating operation that may be used together or separately in accordance with a second embodiment of the invention where the mask support is flexible.

Figure 7A:
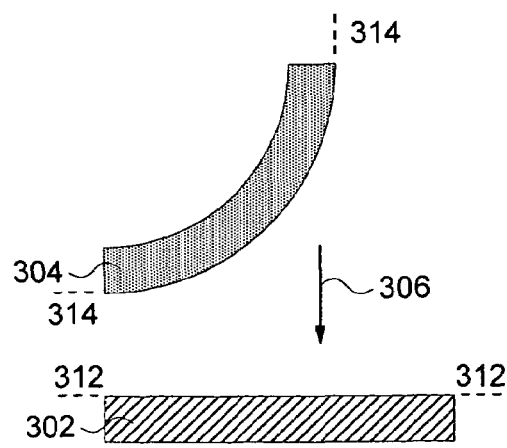
FIGS. 7A-7F defines a non-parallel mating operation and non-parallel un-mating operation that may be used together or separately in accordance with a second embodiment of the invention where the mask support is flexible.

FIG. 7A depicts a schematic side view of an initial state of the mating process where a mask 304 and a substrate 302 are separated by a distance. Substrate 302 has a contact surface 312 which is substantially planar while mask 304 has a contact surface 314 that is curved, bent or otherwise flexed to a convex shape. It is intended that arrow 306 indicate that the mask and the substrate are being brought together using a substantially translational motion. In other embodiments rotational motion may be used alone or in combination with translation motion to cause mating of the mask and substrate surfaces.

Figure 7B:
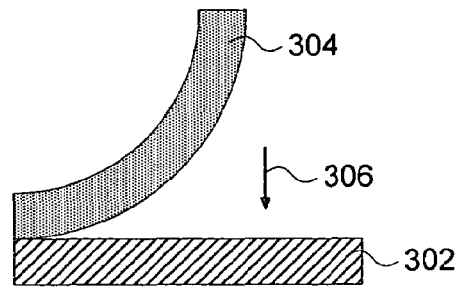

FIG. 7B depicts a schematic side view of the state of the process after mask 304 and substrate 302 have made initial contact at their left most portions. Although 306 indicates that the mask and the substrate are still being brought together along a substantially translation path it is understood that relative motion between the substrate and mask stop at those points where contact has been made but continues where contact has not yet been made.

Figure 7C:
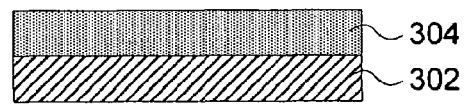

FIG. 7C presents a schematic side view of the state of the process after mask 304 and substrate 302 have been fully mated. After mating is completed selective treatment of the exposed portions of surface 312 and substrate 302 may occur.

Figure 7D:
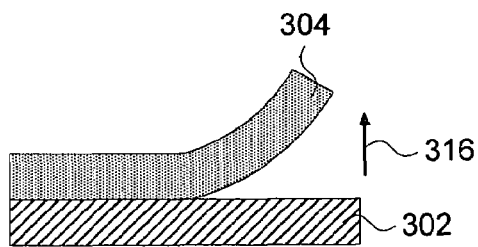

FIG. 7D depicts a schematic side view of the state of the process after treatment has occurred and after the mask has been partly separated from the substrate using a peeling type effect where the rightmost portion of mask 304 is separated form the substrate 302 (e.g. using a relative translational motion) and wherein a line separating mated regions from unmated regions progressively moves from the right most portion of the mask and substrate toward the left most portions. Arrow 316 indicates the relative direction of motion.

Figure 7E:
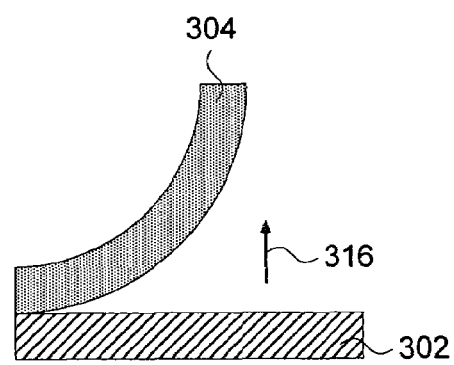

FIG. 7E depicts a schematic representation of the state of the process after mask 304 and substrate 302 have been almost completely separated but where a final contact line remains along their left most portions. Arrow 316 shows the relative direction of separation.

Figure 7F:
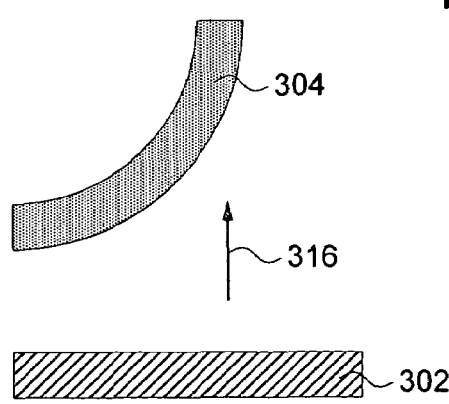

FIG. 7F depicts a schematic representation of the state of the process after mask 304 and substrate 302 have been completely separated by a continued relative motion and direction 316.

In some embodiments the mating and un-mating operations of FIGS. 7A-7C and 7C-7F respectively may occur in the manner indicated. In other embodiments the mating process of FIGS. 7A-7C may be used while an un-mating process different from that shown in FIGS. 7C-7F may be used. Conversely, in still other embodiments a mating process different from that shown in FIGS. 7A-7C may be used after which treatment may occur and then an un-mating process identical to or similar to that depicted in FIGS. 7C-7F may occur.

The mating and un-mating processes of FIGS. 7A-7F obtain a mating region that is a line that separates mated regions from unmated regions by using a mask surface that is convex relative to the shape of the substrate contact surface. In other embodiments the relative convexity may be obtained while using a substrate that has a concave surface facing the mask which has less curvature (i.e. longer radius of curvature) than the curvature (i.e. shorter radius of curvature) than that of the convexity of the mask. In other embodiments the mask may have a substantially planar mating surface prior to contact with the substrate while the substrate has a convex mating surface facing the mask. In still other embodiments the mask may have a concave mating surface facing the substrate prior to mating while the substrate has a convex mating surface facing the mask where the curvature of the convex surface is greater than the curvature of the concave surface (i.e. the substrate has a shorter radius of curvature then that of the mask prior to mating).

In some embodiments instead of having the mask flex or bend to match the contour of the contact surface of the substrate the mask may be relatively rigid (except for possibly some conformability of the a portion of the material from which the mask is made, e.g. the patterned material or contact material of a mask) while the substrate is flexible and is plastically or elastically deformed to conform, or at least substantially conform, with the shape of the mating surface of the mask 304. In still other embodiments both the mask and the substrate may have some amount of flexibility such that conformance of mating surfaces is partially based on the plastic or elastic deformation of the mask 304 and of the substrate 302.

FIGS. 8A-8G define a non-parallel mating operation that may be used in accordance with a third embodiment of the invention where the mask support is flexible and the mask is flexed along two axes.

Figure 8A:
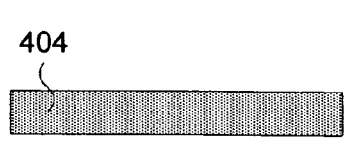
FIGS. 8A-8G defines a non-parallel mating operation that may be used in accordance with a third embodiment of the invention where the mask support is flexible and the mask is flexed along two axes.
Figure 8B:
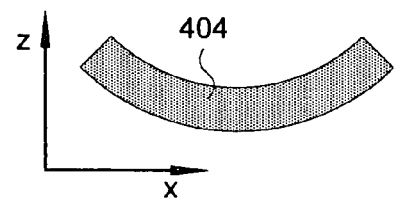

FIG. 8A schematically depicts a side view of a mask 404 while it is in a substantially planar state, while FIG. 8B, on the other hand, schematically depicts a side view of mask 404 while it is being flexed to have a substantially convex shape in the downward direction. In particular, both left and the right portions of the mask are depicted in FIG. 8B as being raised above the central portion of the mask.

Figure 8C:
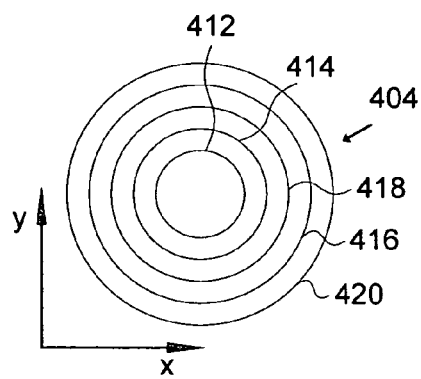

FIG. 8C depicts a top view of the curved mask of FIG. 8B where equal height contour lines in z are shown to be circles. Circle 412 represents a position lower than that of circle 414 which represents a position lower then that of mask surface elements located along contour line 416. Circles 418 and 420 depict still higher equal height contour lines along the mask surface.

Figure 8D:
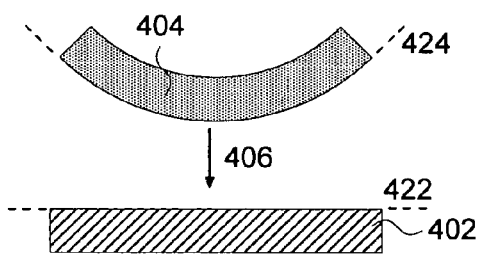

FIG. 8D schematically depicts a side view of the mask of FIG. 8B located above and spaced from a substrate 402. Arrow 406 shows a relative direction of motion between the mask and the substrate to bring mating surface 424 and 422 into contact.

Figure 8E:
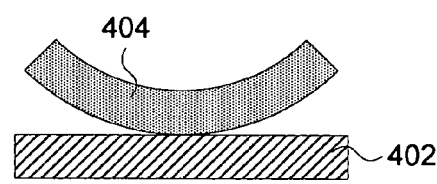
Figure 8F:
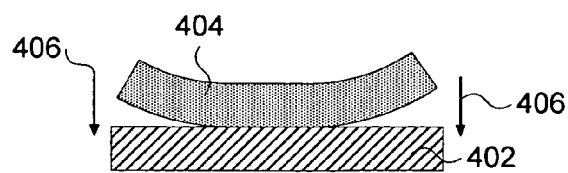
Figure 8G:
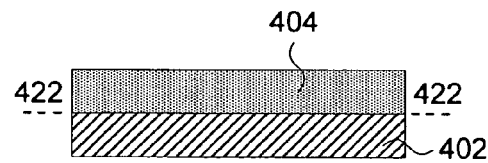

FIG. 8E depicts the state of the process after the mask and substrate have been brought into a point of initial contact, while FIG. 8F provides a schematic depiction of a side view after continued relative motion between the substrate and the mask have caused further mating to occur (i.e. the circle separating the mated regions from the un-mated regions to expand outward toward the edges of the mask and the substrate). Arrows 406 indicate that relative movement between the mask and the substrate continues until complete mating has occurred as shown in FIG. 8G. After mating has occurred, exposed portions of surface 422 of substrate 402 (i.e. portions of surface 422 that are not contacted by protrusions associated with the mating surface 424 of mask 404) may be selectively treated. After treatment the mask and substrate may be separated according to one of the embodiments discussed herein before, by reversing the process of FIGS. 8F, 8E and 8D or by use of some other process that will be apparent to those of skill in the art or that will be proposed herein later.

Figure 9A:
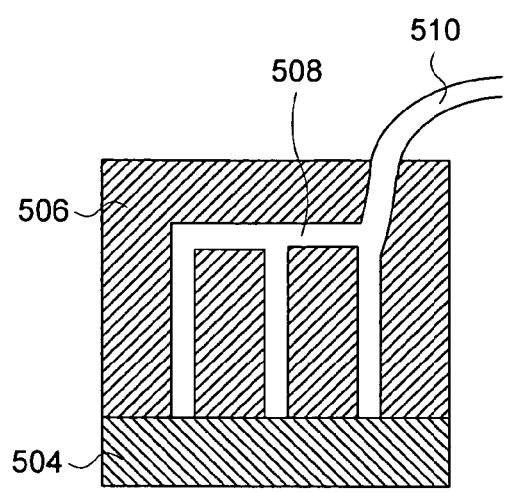
FIGS. 9A and 9B depict a device that uses gas of fluid pressure to flex a mask.
Figure 9B:
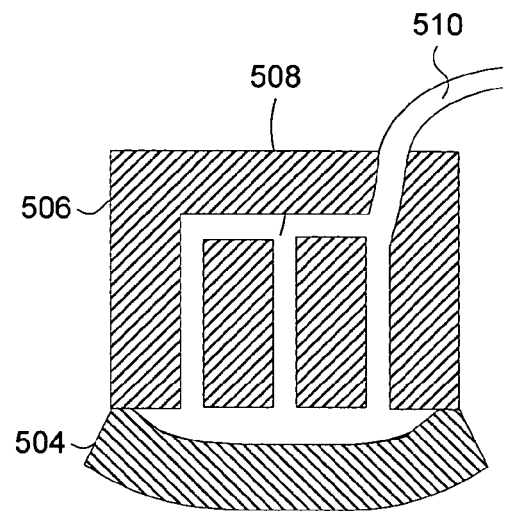

FIGS. 9A and 9B depict a device that uses gas or fluid pressure to flex a mask.

FIG. 9A provides a schematic representation of a side view of a mask 504 below a support structure 506 that includes passages 508 and inlet 510. Mask 504 is deformable and is bonded to support 506 along its perimeter. Inlet 510 is functionally connected to a supply of gas or liquid which can be introduced into passages 508 to apply a force to mask 504 to cause it to deform from its nominally planar shape to a convex shape.

FIG. 9B schematically depicts the structure of FIG. 9A after pressure has been applied to the upper surface of the mask to cause it to transition to a curved configuration. Such a curved configuration may be used in making initial contact with a substrate after which continued relative motion of the substrate and mask can drive the mask back to a substantially planar configuration while completing the mating operation. Once mated and treatment occurs, the mask can be bowed (e.g. by inflating it) to cause progressive separation of the mask from a substrate) and then completion of separation can occur, e.g. by relative translation.

Figure 10A:
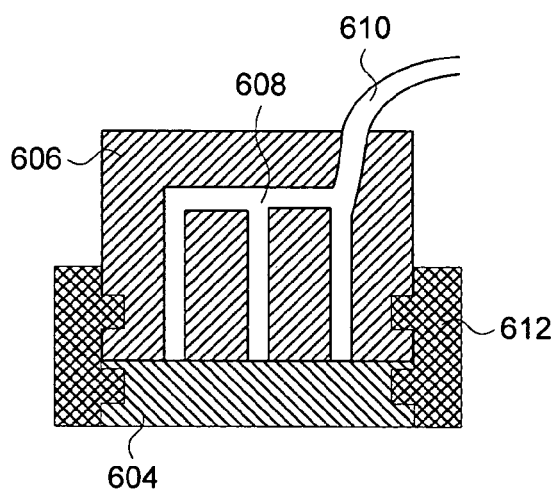
FIGS. 10A and 10B depict a device similar to that of FIGS. 9A and 9B but with a retention ring for holding the edges of the mask to the flexing device.
Figure 10B:
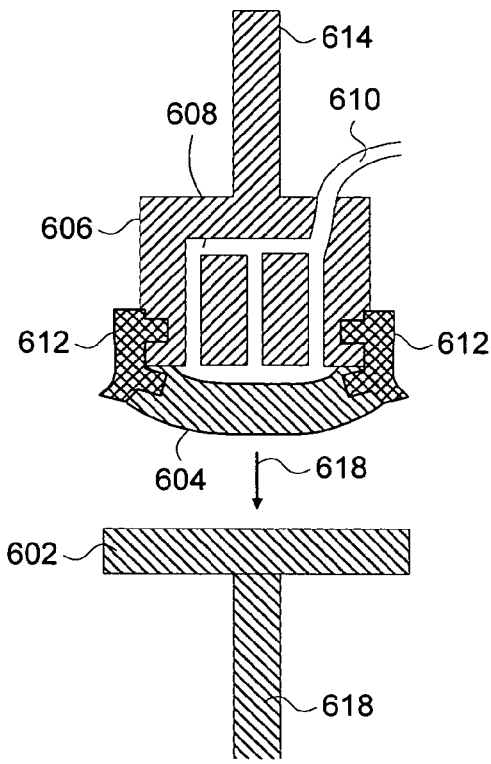

FIGS. 10A and 10B depict a device similar to that of FIGS. 9A and 9B but with a retention ring for holding the edges of the mask to the flexing device.

FIG. 10A provides a schematic representation of a side view of a mask 604, support 606 system similar to that depicted in FIGS. 9A and 9B. Support structure 606 includes passages 608 and inlet 610. In the configuration of FIG. 10A, instead of periphery of the mask being bonded to the support structure as in FIG. 9A a sealing ring 612 is used to hold the mask and the support structure together and to ensure sealing between them.

FIG. 10B depicts the mask support systems of FIG. 10A after it has been inflated to provide mask 604 with a convex surface. FIG. 10B also shows a substrate 602 supported by a shaft 618. Support structure 606 is also shown as connected to a shaft 614. One or both of shafts 614 and 618 are connected to a linear stage which may cause relative motion between the substrate 602 and the mask 604 in the direction of arrow 618 to cause mating. Treatment of the substrate may occur while the substrate and mask are mated and then that substrate and mask may be separated by a combination of movement of the linear stage and the re-inflation of the mask.

In alternative embodiments to those shown in FIGS. 9A-10B, other configurations may be used to allow a gas pressure or liquid pressure to cause bowing of the mask. For example, in some such embodiments bellows types structures may be used to cause bowing of the mask as well as to cause translation of the mask. In other embodiments piston-like structures may be used.

In alternative embodiments, multiple bellows systems may be used, for example, one to cause linear movement and the other to cause creation or collapse of mask curvature. In still other embodiments the masks may be of a rigid structure and the substrate may be flexible such that the masks depicted in FIGS. 9A-10B may be replaced by substrates and the substrate depicted in FIG. 10B may be replaced by a mask.

FIGS. 11A and 11B depict, a side view and a top view respectively, of a substrate holder that allows tilting to occur so as to allow non-planarity between mating surfaces of the mask and of the substrate to become coplanar during mating. FIG. 11A depicts a schematic representation of a side view of a substrate 702 supported by 3 spring elements 706 and FIG. 11B depicts a schematic representation of a top view of substrate 702 and spring elements 706 which extend beyond the circumference of the substrate. During mating operations this substrate configuration may be used to allow unintentional non-parallelness in substrate surfaces to be eliminated. In still other embodiments such a configuration may be useful in allowing intentional non-parallelness between a mask and a substrate to be removed even when using only a translational motion between the mask and the substrate.

FIGS. 12A and 12B depict, a side view and a top view respectively, of a substrate holder that allows tilting to occur with reduced tenancy for lateral displacement so as to allow non-planarity between mating surfaces of the mask and of the substrate to become coplanar during mating. FIG. 12A schematically depicts a side view of a substrate 702 supported by spring elements 706 and a central spherical element 708. In some embodiments, spherical element 708 may held in place by indentations in one or both the backside of the substrate or a platform on which the springs and spherical element sit.

FIG. 12B schematically depicts a top view of the structure of FIG. 12A. It is believed that the central support sphere of FIG. 12A will allow necessary pivoting of the substrate relative to a contact mask so as to allow any non-parallelness in substrate and mask mating surfaces to be accommodated while reducing the risk of displacement of the substrate in a horizontal direction.

Various alternatives to the substrate mounting/positioning embodiments of FIGS. 11A-12B are possible. For example, other spring structures and configurations may be used including coiled springs, a single spring or multiple spring-like elements mounted at the lower center of the substrate with or without use of other spring structures. In still other alternative embodiments, the substrate of FIGS. 11A-12B may be replaced by rigid mask structures. In still other alternative embodiments, rigid mask structures and rigid substrates may be mounted on such spring like elements while facing in opposing directions. One or both of the mask or the substrate may be mounted on a translational stage that may be used to bring the mask and substrate together and/or to separate the mask and the substrate whereby non-parallelness, intentional or otherwise, between the mating surfaces may be accommodated.

FIG. 13 depicts an alternative substrate or substrate holder design for allowing some tilting to between the mask and the substrate to occur during mating so as to allow the surfaces to become coplanar. FIG. 13 schematically depicts a substrate 802 mounted on a deformable material 806 (preferably an elastic material but a plastic deformable material may also work) which in turn is mounted on a rigid support material 808. During mask mating operations the deformable material may allow any non-parallelness, intentional or otherwise, to be accommodated for.

As noted above, the masks used in the various embodiments of the present invention may be used for either selectively depositing material or for selectively etching material. Techniques for building three-dimensional structures in combination with selective etching operations is more full described in U.S. application Ser. No. 10/434,519, filed on May 7, 2003, by Dennis R. Smalley entitled "Methods of and Apparatus for Electrochemically Fabricating Structures Via Interlaced Layers or Via Selective Etching and Filling of Voids" which is herein incorporated by reference as if set forth in full. This referenced application also discloses techniques for forming multilayer three-dimensional structures on a layer-by-layer basis where building deviates from a strict planar layer on planar layer build up process in favor of a process that interlaces material deposited on some or all layers. These alternative formation techniques may be used in combination with the masks and mask mating techniques disclosed explicitly herein The masks, masking techniques, and structure formation techniques disclosed explicitly herein may benefit by using the enhanced mask mating techniques disclosed in U.S. Patent Application No. 60/525,797 filed concurrently herewith by Jeffrey A. Thompson and entitled "EFAB Methods Including Controlled Mask to Substrate Mating". This referenced application is incorporated herein by reference as if set forth in full herein. This referenced application teaches the treatment of substrates, formation of structures, and formation of multilayer structures using contact masks where a controlled mating of contact masks and substrates is used. Some embodiments involve controlled mating at speeds equal to or less than 10 microns/second, more preferably equal to or less than 5 microns/second, and even more preferably equal to or less than 1 micron/second. Some embodiments involve controlled mating that uses a higher speed of approach when further away and a slower speed of approach to cause mating. Some embodiments involve controlled mating that uses a higher speed of approach when making a preliminary contact, then backing away a desired distance, and then making a mating approach that cause mating while using a slower mating speed.

The masks, masking techniques, and structure formation techniques disclosed explicitly herein may benefit by using the enhanced mask mating techniques disclosed in U.S. patent application Ser. No. 10/724,513 filed concurrently herewith by Adam L. Cohen et al. and entitled "Non-Conformable Masks and Methods and Apparatus for Forming Three-Dimensional Structures". This referenced application is incorporated herein by reference as if set forth in full herein. This referenced application teaches the use of contact masks that may not have conformable mating surfaces but that may have mask portions behind the contact portions that provide some conformability.

Various other embodiments of the present invention exist. Some of these embodiments may be based on a combination of the teachings herein with various teachings incorporated herein by reference. Some embodiments may form structures without using any blanket deposition processes and/or they may not use planarization processes. Some embodiments may involve the selective deposition of a plurality of different materials on a single layer or on different layers. Some embodiments may use selective or blanket depositions processes that are not electrodeposition processes. Some embodiments may use selective deposition processes on some layers that are not proximity or contact masking processes (e.g. they may be contact masking processes or even direct patterning processes) and that are not even electrodeposition processes (e.g. they may be PVD processes, electroless deposition process, electrophoretic deposition processes, or the like). Some embodiments may use nickel as a structural material while other embodiments may use different materials such as, for example, gold, silver, or any other electrodepositable materials that can be separated from the copper and/or some other sacrificial material. Some embodiments may use copper as the structural material with or without a sacrificial material. Some embodiments may remove a sacrificial material while other embodiments may not. In some embodiments the anode may be different from a proximity or contact mask support and the support may be a porous structure or other perforated structure. Some embodiments may use multiple proximity or contact masks with different patterns so as to deposit different selective patterns of material on different layers and/or on different portions of a single layer. In some embodiments, the depth of deposition will be enhanced by pulling the proximity or contact mask away from the substrate as deposition is occurring in a manner that allows a seal between the a portion of the CC mask and the substrate to shift from the face of mask to the inside edges of the mask.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A process for forming a multilayer three-dimensional structure, comprising:
   (a) forming and adhering a layer of material to a substrate, wherein the substrate may include one or more previously formed layers;
   (b) repeating the forming and adhering operation of (a) a plurality of times to build up a three-dimensional structure from a plurality of adhered layers;
   wherein the formation of each of at least a plurality of the adhered layers, comprises:
      (1) obtaining a selective pattern of deposition of a first material having at least one void, comprising at least one of:
         (a) selectively electrodepositing a first material onto the substrate such that at least one void remains, comprising:
            (i) bringing a mating surface of a contact mask and a mating surface of the substrate together in a non-parallel manner in the presence of an electrolyte so that an initial contact between the mating surface of the substrate and the mating surface of the contact mask occurs in a controlled manner at only selected locations, and wherein continued relative movement between the mask and the substrate bring substantially all relevant mating surfaces of the mask into contact with the substrate and so that mating leaves paths for excess electrolyte to escape from between the mask and the substrate;
            (ii) electrodepositing the first material onto the substrate with the contact mask in place;
            (iii) separating the contact mask and the substrate to expose the at least one void; or
         (b) electrodepositing a first material onto the substrate and selectively etching the deposit of the first material to form at least one void therein, comprising:
            (i) bringing a mating surface of a contact mask and a mating surface of the first material together in a non-parallel manner in the presence of an electrolyte so that initial contact between the mating surface of the first material and the mating surface of the contact mask occurs in a controlled manner at only selected locations, and where after continued relative movement of the mask and the substrate bring substantially all of the mating surface of the mask into contact with the first material and so that mating leaves paths for excess electrolyte to escape from between the mask and the first material;
            (ii) etching into the first material with the contact mask in place to form at least one void; and
            (iii) separating the contact mask and the first material.

2. The process of claim 1 wherein a separation between mated and unmated portions of the mask substantially defines a straight line.

3. The process of claim 1 wherein a separation between mated and unmated portions of the mask, prior to bringing substantially all of the mating surface of the mask into contact with the first material, substantially defines a closed loop.

4. The process of claim 3 wherein the closed loop is substantially a circle.

5. The process of claim 1 wherein, at initial contact, some portions of the mating surface of the mask and corresponding mating locations on the substrate are separated by a distance greater than that dictated by an alignment tolerance between the mask and the substrate.

6. The process of claim 1 wherein the mask, prior to mating with the substrate is forced to have a curvature that is greater than a tolerance in setting curvature.

7. The process of claim 6 wherein the force comprises excess gas or liquid pressure on one side of the mask.

8. The process of claim 1 wherein, at initial contact, the mating surface of the mask is substantially planar, though potentially discontinuous, wherein the mating surface of the substrate or the mating surface of the first material is substantially planar, and wherein a normal to the plane of the mating surface of the mask is not parallel to a normal to the plane of the mating surface of the substrate or to the mating surface of the first material by an amount greater than that which is derived from an alignment tolerance.

9. The process of claim 1 wherein the formation of each of at least the plurality of adhered layers additionally comprises at least one planarization operation.

10. The process of claim 1 wherein the formation of each of at least the plurality of adhered layers comprises deposition of at least a second material.

11. The process of claim 1 wherein a shape of the mating surface of the substrate or of the first material remains substantially constant during a course of mating and a shape of the mating surface of the mask changes during the course of mating such that upon completion of mating, the shapes of the mating surface of the mask, and of the mating surface of the substrate or the mating surface of the first material are substantially the same in at least those areas intended for mating.

12. The process of claim 1 wherein a shape of the mating surface of the mask remains substantially constant during a course of mating and a shape of the mating surface of the substrate changes during the course of mating such that upon completion of mating, the shapes of the mating surface of the mask, and of the mating surface of the substrate are substantially the same in at least those areas intended for mating.

13. The process of claim 1 wherein a shape of the mating surface of the mask and a shape of the mating surface of the substrate changes significantly during the course of mating such that upon completion of mating, the shapes of the mating surface of the mask, and of the mating surface of the substrate are substantially the same in at least those areas intended for mating.

14. A process for forming a multilayer three-dimensional structure, comprising:
  (a) forming and adhering a layer of material to a substrate, wherein the substrate may include one or more previously formed layers;
  (b) repeating the forming and adhering operation of (a) a plurality of times to build up a three-dimensional structure from a plurality of adhered layers;
  wherein the formation of each of at least a plurality of layers, comprises:
    (1) obtaining a selective pattern of deposition of a first material having at least one void, comprising at least one of:
      (a) selectively electrodepositing a first material onto the substrate such that at least one void remains, comprising:
        (i) bringing a mating surface of a contact mask and a mating surface of the substrate together in a non-parallel manner in the presence of an electrolyte so that on initial contact the mating surface of the mask has a first curvature and a mating surface of the substrate has a second curvature, wherein the first curvature has a nominal radius that is less than that of the second curvature, and wherein after initial contact a separation of other portions of the mask and the substrate is further reduced so that additional mating occurs and such that one or both of the first and second curvatures change so that that first and second curvatures become more alike and so that mating leaves paths for excess electrolyte to escape from between the mask and the substrate;
        (ii) electrodepositing the first material onto the substrate with the contact mask in place;
        (iii) separating the contact mask and the substrate to expose the at least one void; or
      (b) electrodepositing a first material onto the substrate and selectively etching the deposit of the first material to form at least one void therein, comprising:
        (i) bringing a mating surface of a contact mask and a mating surface of the first material together in a non-parallel manner in the presence of an electrolyte so that on initial contact the mating surface of the mask has a first curvature and a mating surface of the first material has a second curvature, wherein the first curvature has a nominal radius that is less than that of the second curvature, and wherein after initial contact a separation of other surfaces of the mask and the substrate is further reduced so that additional mating occurs and such that one or both of the first and second curvatures change so that that first and second curvatures become more alike and so that mating leaves paths for excess electrolyte to escape from between the mask and the first material;
        (ii) etching into the first material with the contact mask in place to form at least one void; and
        (iii) separating the contact mask and the first material.

15. The process of claim 14 wherein the second curvature retains a relatively constant value during mating and the first curvature changes to become more like the second curvature.

16. The process of claim 14 wherein the first curvature retains a relatively constant value during mating and the second curvature changes to become more like the first curvature.

17. A process for forming a multilayer three-dimensional structure, comprising:
  (a) forming and adhering a layer of material to a substrate, wherein the substrate may include one or more previously formed layers;
  (b) repeating the forming and adhering operation of (a) a plurality of times to build up a three-dimensional structure from a plurality of adhered layers;
  wherein the formation of each of at least a plurality of layers, comprises:
    (1) obtaining a selective pattern of deposition of a first material having at least one void, comprising at least one of:
      (a) selectively electrodepositing a first material onto the substrate such that at least one void remains, comprising:
        (i) bringing a mating surface of a contact mask and a mating surface of the substrate together in a non-parallel manner in the presence of an electrolyte so that on initial contact, the mating surface of the mask is more convex relative to the mating surface of the substrate, and wherein after further relative movement between the mask and the substrate mating is completed and so that mating leaves paths for excess electrolyte to escape from between the mask and the substrate;
        (ii) electrodepositing the first material onto the substrate with the contact mask in place;
        (iii) separating the contact mask and the substrate to expose the at least one void; or
      (b) electrodepositing a first material onto the substrate and selectively etching the deposit of the first material to form at least one void therein, comprising:
        (i) bringing a mating surface of a contact mask and a mating surface of the first material together in a non-parallel manner in the presence of an electrolyte so that on initial contact the mating surface of the mask is more convex relative to the mating surface of the substrate, and wherein after further relative movement between the mask and the substrate mating is completed and so that mating leaves paths for excess electrolyte to escape from between the mask and the substrate;
        (ii) etching into the first material with the contact mask in place to form at least one void; and
        (iii) separating the contact mask and the first material.

18. The process of claim 17 wherein at initial contact the mating surface of the mask is convex while the mating surface of the substrate is (1) concave toward the mask with a larger radius of curvature, (2) planar, or (3) convex away from the mask.

19. The process of claim 17 wherein at initial contact the mating surface of the mask is planar while the mating surface of the substrate is convex away from the mask.

20. The process of claim 17 wherein at initial contact the mating surface of the mask is concave while the mating surface of the substrate is convex away from the mask with a smaller radius of curvature.

21. The process of claim 1 wherein at initial contact between the mating surface of the substrate the mating surface of the mask has a first curvature and the mating surface of the substrate has a second curvature, wherein the first curvature has a nominal radius that is less than that of the second curvature, and wherein after initial contact a separation of the mask and the substrate is further reduced so that additional mating occurs and such that one or both of the first and second curvatures change so that that first and second curvatures become more alike.

22. The process of claim 1 wherein at initial contact between the mating surface of the substrate and the mating surface of the contact mask, the mating surface of the mask is more convex relative to the mating surface of the substrate, and wherein after further relative movement between the mask and the substrate mating is completed.

23. The process of claim 14 wherein at initial contact between the mating surface of the substrate and the mating surface of the contact mask, the mating surface of the mask is more convex relative to the mating surface of the substrate, and wherein after further relative movement between the mask and the substrate mating is completed.

* * * * *